United States Patent [19]

Shimada et al.

[11] Patent Number: 4,689,652
[45] Date of Patent: Aug. 25, 1987

[54] IMAGE SENSOR

[75] Inventors: Satoshi Shimada, Hitachi; Kanji Kawakami, Mito; Masaharu Tadauchi, Hitachi; Motohisa Nishihara, Katsuta, all of Japan

[73] Assignee: Hitachi, Ltd., Tokyo, Japan

[21] Appl. No.: 710,109

[22] Filed: Mar. 11, 1985

[30] Foreign Application Priority Data

Mar. 12, 1984 [JP] Japan ................................. 59-47472

[51] Int. Cl.$^4$ ........................ H01L 27/14; H04N 1/00
[52] U.S. Cl. ....................................... 357/30; 357/74; 358/256; 358/213.13; 355/11
[58] Field of Search ............................ 357/30, 74, 84; 350/452; 358/256, 287, 288, 302, 280, 213; 313/500; 355/11; 250/211 J, 211 R

[56] References Cited

U.S. PATENT DOCUMENTS 4,191,593 3/1980 Cacheux ............................. 357/30

FOREIGN PATENT DOCUMENTS 0122172 9/1981 Japan .
0074720 5/1982 Japan .
0148366 9/1982 Japan ................................. 357/84
0105668 6/1983 Japan .
0220106 12/1983 Japan .
0121974 7/1984 Japan .

OTHER PUBLICATIONS

Oikawa et al., "Array of Distributed Index Planar Micro Lenses Prepared from Ion Exchange Technique", J. Journal of Applied Physics, vol. 20, No. 4, Apr. 1981, pp. L296-278.
Komiya, "Micro-Optics in Facsimile-A Contact Type Imaging System", Jul. 4-5, 1983, 4th Topical Meeting on Gradient-Index Optical Imaging Systems, pp. 220-223.
Tajiri et al., "A New Lensless Image Sensor for Facsimile", Jul. 4-5, 1983, 4th Topical Meeting on Gradient Index Optical Imaging Systems, pp. 236-239.

Primary Examiner—James W. Davie
Assistant Examiner—Georgia Y. Epps
Attorney, Agent, or Firm—Antonelli, Terry & Wands

[57] ABSTRACT

An image sensor comprises a transparent substrate, an optical lens formed integrally in one major surface of the transparent substrate, and a photosensor provided on the side of the other major surface of the transparent substrate and having output electrodes, wherein light incident on the optical lens is focussed by the lens onto the photosensor through the transparent substrate.

10 Claims, 23 Drawing Figures

IMAGE SENSOR

BACKGROUND OF THE INVENTION

The present invention relates to an image sensor for converting optical information into an electrical signal. More particularly, the invention concerns an improved structure of the image sensor which can be fabricated in a miniature size with the overall length of optical path being shortened.

In general, information processing apparatus such as, for example, facsimile or the like is equiped with an information or data input device which includes an image sensor for converting optical information into an electrical signal. In the hitherto known image sensor, the optical path realized in the sensor is necessarily of a great length in order to fulfill the requirement for attaining a desired accuracy, which in turns imposes restriction on miniaturization of the information apparatus as a whole even if endevour is made to increase the integration density of electric circuits as incorporated. Under the circumstance, difficulty is encountered in meeting the existing demand for miniaturization of the information apparatus or system particularly for home use.

FIG. 1 of the accompanying drawings shows a typical one of the conventional facsimile equipment in which a document 4 is irradiated or illuminated with light emitted by a light source 2 wherein light reflected by the document 4 is focused onto a photodiode 8 through an optical lens system 6. In this case, the size of image projected onto the photodiode 8 is about one tenth (1/10) of that of the document, while the distance from the document to the photodiode, i.e. the length of the optical path is about 300 to 500 mm. Consequently miniaturization of the apparatus is difficult because of great length of the optical path.

FIG. 2 of the accompanying drawings shows another example of the conventional image sensor destined for use in the facsimile equipment. Referring to the figure, a document 4 is illuminated with light emitted by light sources 2, the resulting reflected light being directed onto a photodiode array 12 by way of a gradient-index fiber array 10. In the case of this image sensor, the image projected on the photodiode array 12 is of a same size as that of the image on the document, while the optical path length can be reduced down to 10 to 20 mm as compared with the arrangement shown in FIG. 1. Accordingly, the apparatus can be considerably reduced in the overall size as compared with the apparatus shown in FIG. 1. However, when the facsimile equipment is to be capable of handling the document of a large size such as A4 format, the number of fibers which constitute the gradient-index fiber array 10 amounts to as many as about one thousand, involving complicated structure as well as high manufacturing cost.

FIG. 3 shows a further example of the already proposed image sensor. Referring to the figure, a transparent substrate 20 has a major surface deposited with a light shielding film 22 over which transparent insulation films or layers 24 and 26 are formed, wherein a photosensor array 28 is disposed within the insulation layers 24 and 26. In the case of this image sensor, the document 4 is positioned in intimate contact with the insulation layer 26. Light emitted by a light source 2 is introduced from the rear side of the transparent substrate 20 and illuminates the document 4 through the transparent substrate 20, windows formed in the light shielding film 22 and the transparent insulation films 24 and 26. The light reflected by the document is projected onto the photosensor array 28 through the transparent insulation film 26. It will be seen that the reflected light is projected onto the photosensor array without using a lens in the case of this image sensor, which thus provides advantages in that the optical path length can be reduced to 0.1 to 0.2 mm by virtue of the intimate contact between the document and the insulation film or layer 26 and that the lens is rendered unnecessary, making thus it possible to realize the sensor in a simplified structure. On the other hand, however, since the transparent insulation layer or film 26 which is destined to protect the photosensors 28 is brought into contact with the document, the surface of the insulation film 26 which contacts slideably with the document 4 may be abrased and becomes opaque, to a disadvantage.

The structures shown in FIGS. 2 and 3 are disclosed in "4-th Topical Meeting on Gradient-Index Optical Imaging Systems", July 4–5, 1983, p.p. 220–223 and 236–239.

Furthermore, there is disclosed in Japanese Patent Application Kokai (Laid-Open) No. 105668/83 an image sensor of a structure in which a transparent insulation substrate 39 and a document 4 are brought into slideable contact with each other, wherein a groove 32 of an arcuate cross-section is formed in the slideably contacting surface of the transparent insulation substrate 39 at the location where light is reflected from the document 4, as shown in FIG. 4 of the accompanying drawings. With this structure, the portion of the transparent insulation substrate 39 through which the optical path extend is protected from becoming opaque. However, since light reflected from the document 4 undergoes scattering at the groove 32, the amount of light falling on the photosensor 34 is decreased, resulting in a correspondingly lower output of the photosensor, to a disadvantage.

SUMMARY OF THE INVENTION

An object of the present invention is to eliminate the shortcomings of the hitherto known image sensors described above and provide an image sensor in which the length of optical path extending from a document to photosensitive elements can be shortened and the output of the photosensitive elements can be correspondingly increased.

In view of the above object, there is provided according to an aspect of the invention an image, sensor which comprises a transparent substrate, an optical lens formed integrally with the transparent substrate in one major surface thereof, and a photosensor provided on the side of the other major surface of the transparent substrate, wherein light incident on the optical lens is focused thereby onto the photosensor through the transparent substrate.

BRIEF DESCRIPTION OF THE DRAWINGS

The above and other objects, features and advantages of the invention will be more apparent from the following description taken in conjunction with the drawings, in which.

DESCRIPTION OF THE PREFERRED EMBODIMENTS

Now, the invention will be described in detail in conjunction with the preferred embodiments.

Figure 5A:
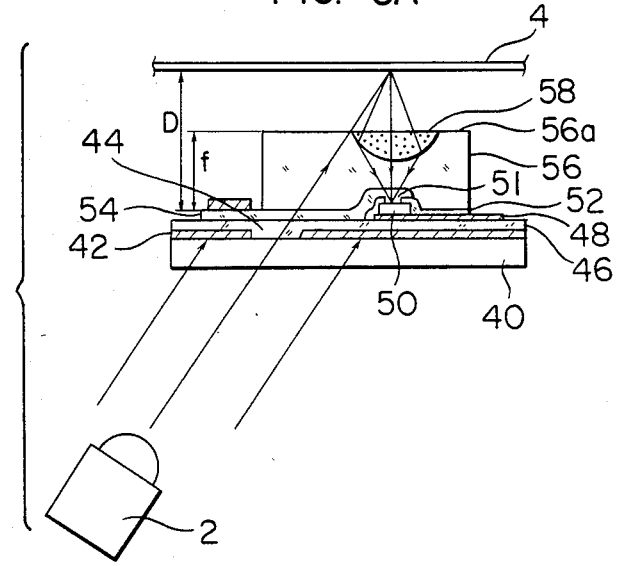
FIG. 5A is a sectional view showing an image sensor according to a first embodiment of the present invention.
Figure 5B:
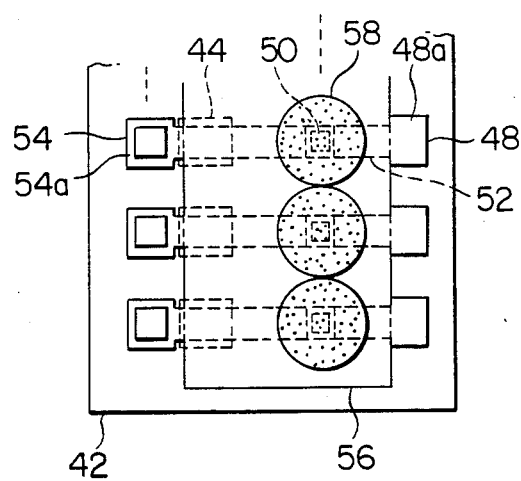
FIG. 5B is a plan view of the same.
Figure 6A:
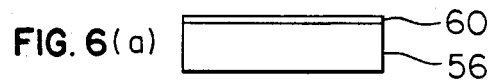
FIGS. 6(a)–6(d) are views for illustrating a process of fabricating an optical lens array of the image sensor according to the first embodiment of the invention.
Figure 6B:
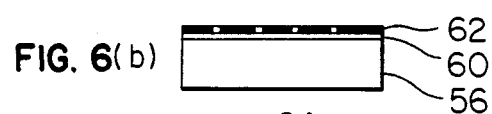
Figure 6C:
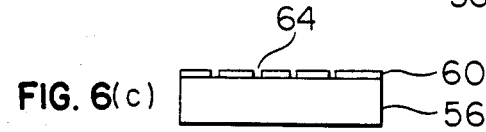
Figure 6D:
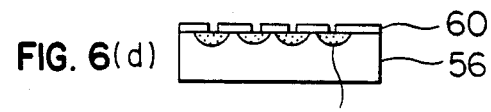

FIGS. 5A and 5B are, respectively, sectional view and plan view showing an image sensor according to a first embodiment of the invention, which image sensor is destined to be used in a facsimile equipment. In the illustrated structure of the image sensor, a plurality of photosensors and lenses each constituting parts of the image sensor are arrayed in a row. Referring to FIGS. 5A and 5B, a reference numeral 40 denotes a transparent substrate which transmits therethrough light emitted by a light source 2. The transparent substrate 40 should preferably be made of a material which can withstand a high temperature and other emvironmental influences encountered in a semiconductor fabricating process. The material may be boro-silicated glass, Pyrex available from Corning Corporation or the like. Although it is preferred that the transparent substrate 40 be realized as thin as possible, the substrate 40 may desirably have a thickness in a range of 0.2 to 2.0 mm so that the substrate can withstand the handling, treatment or the like in the semiconductor fabricating process. A numeral 42 denotes a light shielding film for shielding light emitted by the light source 2. The light shielding film 42 may be formed through vapor deposition or evaporation of a material such as Cr over one major surface of the transparent substrate 40, which surface is located on the side of a document 4. Subsequently, a plurality of windows 44 are formed in the light shielding film 42 at locations corresponding to those of the photosensors through selective etching or the like. A numeral 46 denotes a transparent insulation film formed of SiOhd 2, for example, and deposited through CVD (chemical vapor deposition) process over the whole major surface of the light shielding film 42 and the windows 44. A numeral 48 denotes plate-like electrodes which are disposed on the major surface of the transparent insulation film 46 and which may be formed of aluminum (Al) or the like through vapor deposition.

Each electrode 48 has one end formed as an output terminal 48a for external connection, while there is provided on the other end of the electrode 48 a thin-film photosensor such as e.g. photodiode 50 serving as the photosensitive element. The photodiode 50 is made of a semiconductor material having a PIN-junction.

The photodiode 50 may be formed in a manner that a silicon thin film (P layer) including impurity of n-type such as phosphorus is deposited on the substrate through a CVD process or a glow-discharge process, a pure silicon layer (I layer) including no impurity is subsequently deposited on the P layer and then a silicon layer (N-layer) including impurity of p-type such as boron is deposited on the I layer to thereby form the PIN-junction. Each of the P, I and N layers has a thickness of about 0.1 $\mu$m.

An insulation film 52 is formed on the side surface and top surface of each photodiode 50 exclusive of a light receiving region 51 as well as on the top and lateral surfaces of the electrode 48. The insulation film 52 may be formed, for example, of $SiO_2$ through e.g. CVD process.

Formed over the light receiving region 51 of each photodiode 50 is a transparent electrode 54 through deposition of an electrically conductive transparent material such as e.g. ITO, which electrode 54 extends over the transparent insulation film 46 in the direction opposite to the electrode 48 and has an end 54a serving as an output terminal for external connection. Each transparent electrode 54 may be formed of $SNO_2$ or $IN_2O_3$, for example, through CVD process. Each of the electrodes 48 and 54 may be a CrCuAu layer with a thickness of about 1 $\mu$m.

A number of photosensor units each constituted by the photodiode 50 and the electrodes 48 and 54 are arrayed in a row in the direction perpendicular to the direction in which the electrodes 48 and 54 extend, whereby a photosensor array is formed. A pitch of the photosensors may be in a range of 8–16/mm and the light receiving region 51 of each photodiode has a size of 50 $\mu$m $\times$ 50$\mu$m.

The thickness of the photosensor unit (42, 50, 54) is in a range of about 0.5 to 3 $\mu$m.

Subsequently, a transparent substrate 56 of a substantially rectangular parallelepiped is correspondingly deposited on the photosensor array so as to cover the photodiodes 50 and the electrodes 48 and 54 with the output terminal end portions 48a and 54a of the electrodes 48 and 54 being exposed. The transparent substrate 56 may preferably be made of glass such as soda glass containing a metal ion such as Na or Pb or alternatively plastic material.

It should be noted that lenses 58 are formed in the major surface of the transparent substrate 56 located on the side of the document 4 in correspondence to the photodiodes 50, respectively. Each lens 58 is so designed as to have a focal length which coincides with the thickness of the transparent substrate 56 so that the incident light impinges on the light receiving region of the photodiode 50. The lenses 58 may be formed with the aid of photolithography technique, by way of example.

A photolithographic process for realizing lenses 58 may be carried out in the manner mentioned below by referring to FIGS. 6(a)–6(d). At first, a photoresist material 60 is applied over the major surface 56a of the transparent substrate 56, as shown at (a) in FIG. 6, which is followed by disposition of a mask 62 on the photoresist layer 60, the mask 62 having a desired pattern formed therein for realizing the lenses 58, as shown at (b) in FIG. 5. Configuration of the mask coincides with that of the transparent substrate 56 shown in FIG. 5B, while the pattern is constituted by a plurality of circular apertures arrayed in a row. Next, the mask is irradiated with ultraviolet ray or the like and the photoresist 60 is selectively removed, as shown at (c) in FIG. 6. Subsequently, the transparent substrate 56 is doped with Tl or Ag-ions through windows 64 formed in the photoresist layer 60 serving now as the mask and then undergoes thermal diffusion treatment, as will be seen in FIG. 6 at (d). As the result, Na-ions in the transparent substrate 56 are replaced by Tl or Ag-ions which are distributed in a pattern like a semi-convex lens, as shown in FIG. 5A and FIG. 6 at (d). Concentration of the dopant ions is reduced as the depth of lens increases. It will be understood that the refractive index of the material within the region of each lens differs from that of the remaining material of the transparent substrate 56, whereby each lens 56 serves as a convex lens.

After the lens array composed of the individual lenses 58 arranged in a row has been formed, photoresist 60 is removed.

In this connection, it should be mentioned that diffusion of Tl or Ag-ions in the transparent substrate 56 can be carried out by resorting to electric field implantation process.

The shape or configuration of the lens is determined in dependence on temperature and time etc. at which the dopant diffusing treatment is carried out.

In view of the fact that the thickness of the transparent substrate 56 is preferably in a range of 0.1 to 2.0 mm, the focal length of the lens may be in a range of 0.1 to 2.0 mm.

The lens array may also be realized in accordance with a process mentioned below.

At first, a plurality of circular films with a thickness of a few μm made, for example, of a transparent synthetic resin are formed in a row on the transparent substrate 56 through a photolithography process. Subsequently, the synthetic resin films are heated to be molten, to thereby form semi-convex lenses of synthetic resin.

In case the image sensor constructed in the manner described above is to be employed in a facsimile equipment, a light source 2 is disposed at the rear side of the transparent substrate or plate 40, as is shown in FIG. 5A. Then, the document 4 is illuminated with light emitted by the light source 2 through the transparent substrate or plate 40, the windows 44 formed in the light shielding film 42, the transparent electrodes 54 and the transparent substrate 56, wherein the light rays reflected from the document 4 are collected onto the photodiodes 50 through the associated lenses 58, as will be seen in FIG. 5A.

The light source 2 may be constituted by a single rod-like source such as, for example, fluorescent lamp tube which is positioned in parallel with the photodiode array. Alternatively, the light source 2 may be constituted by a set of spot light sources disposed in one-to-one correspondence with the individual photodiodes.

With the structure of the image sensor described above, a part of the light emitted by the light source 2 is directed to the document 4 through the windows 44, and light reflected at the document 4 is focused onto the top faces of the photodiodes through the associated lenses 58. The output voltages of the photodiodes 50 which vary in response to the image depicted on the document 4 are transmitted to a signal processing unit (not shown) through the electrodes 48 and 54.

Figure 3:
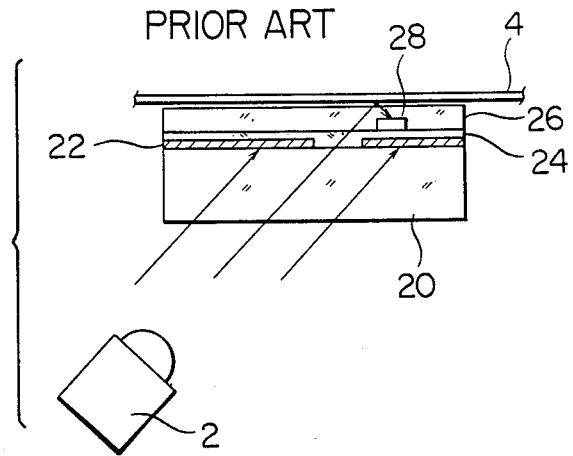
Figure 4:
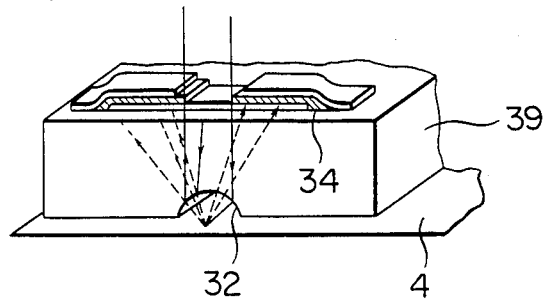

Since the lenses 58 are formed through photolithography or the like technique in the case of the embodiment illustrated and described above, it is possible to realize the focal length f of a small value on the order of e.g. 0.1 to 5.0 mm for each lens. Further, the pitch of individual lenses of the lens array, i.e. the pitch of individual photosensors of the photosensor array can be reduced to as small as about 125 μm. Accordingly, the optical path length D can be realized in a range of about 0.2 to 10.0 mm. In other words, the optical path length of the image sensor according to the illustrated embodiment can be made substantially equal to the optical path length of the hitherto known image sensor of the type shown in FIGS. 3 and 4, where the document is placed in intimate contact with the image sensor.

Moreover, because of physical separation of the image sensor from the document, there arises no fear that the transparent substrate 56 disposed in opposition to the document should become opaque.

The characteristics of the image sensor according to the present invention are listed in the following Table 1 in comparison with those of the hitherto known various image sensors.

TABLE 1

Figure 1:
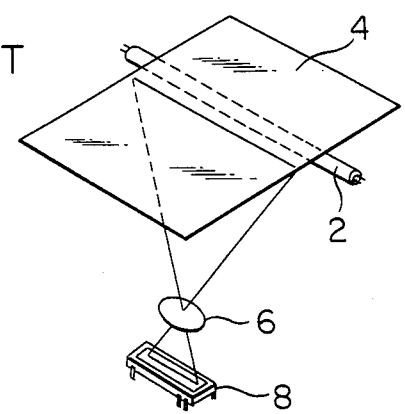
FIG. 1 is a view for illustrating the concept of an hitherto known image sensor.
Figure 2:
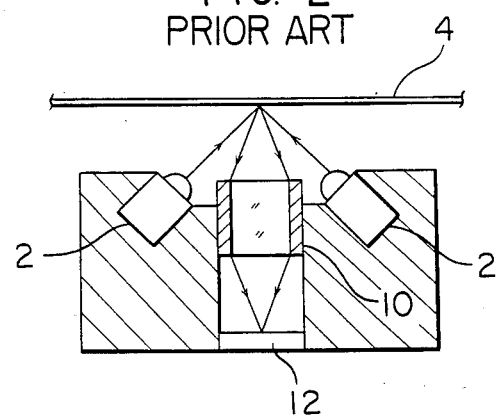
FIGS. 2 to 4 are sectional views of hitherto known image sensors, respectively.

| No. | Optical structure | Focal length (f) | Magnification factor | Pitch of photosensor array | F number | M.T.F. | Optical path length (D) |
|---|---|---|---|---|---|---|---|
| 1 | Optical lens (single, FIG. 1) | ≈30 mm | 10:1 | 7~14 μm | 4 | 0.5~0.7 | 300~500 mm |
| 2 | Gradient-index fiber array (FIG. 2) | 5~10 | 1:1 | 125 | 1 | 0.5~0.7 | 10~20 |
| 3 | Planar type lens array (present invention) | 0.1~5 | 1:1 | 125 | 0.5 | 0.5~0.7 | 0.2~10 |
| 4 | Lensless type (FIGS. 3, 4) | | 1:1 | 125 | 0.5~1 | 0.3~0.5 | 0.1~0.2 |

The lens array of the image sensor according to the present invention is referred to as the planar type lens array. As will be seen in the Table 1, the image sensor according to the invention is featured by the shorter optical path length and the smaller value of F number when compared with the sensor employing the optical lens shown in FIG. 1 as well as the sensor incorporating the gradient-index fiber array shown in FIG. 2. Thus, the image sensor according to the invention can be realized in a reduced size with an enhanced sensitivity.

Further, because the lenses of the image sensor according to the invention can be formed through photo lithography or the like technique, the sensor is suited for the fabrication on a large scale basis with high accuracy and yield, while reducing manufacturing cost.

Figure 7A:
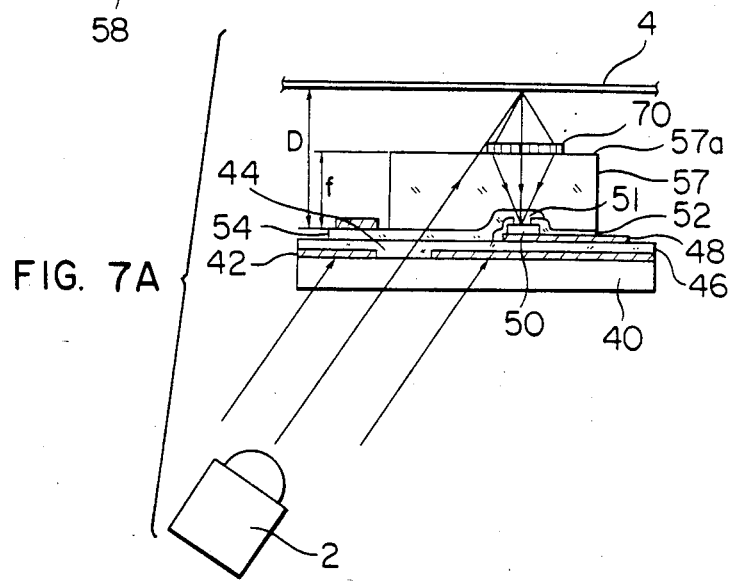
FIGS. 7A and 7B are, respectively, sectional view and plan view showing an image sensor according to a second embodiment of the invention.
Figure 7B:
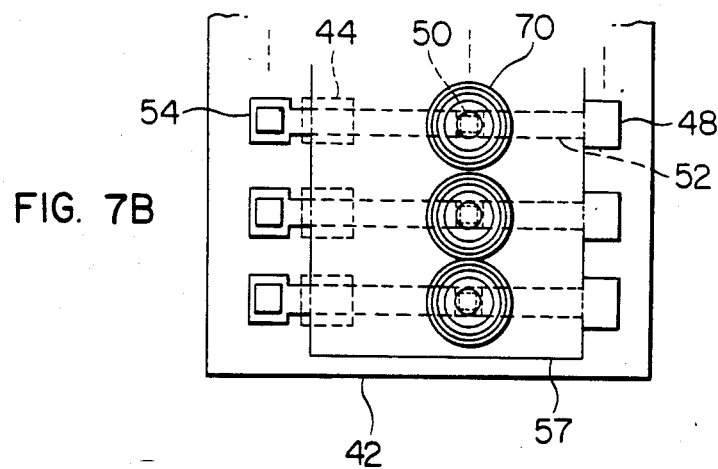
Figure 8A:
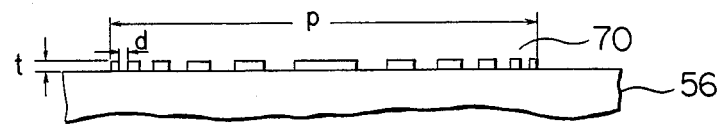
FIGS. 8A and 8B are sectional views of Fresnel lenses which can be employed in the second embodiment of the invention.
Figure 8B:
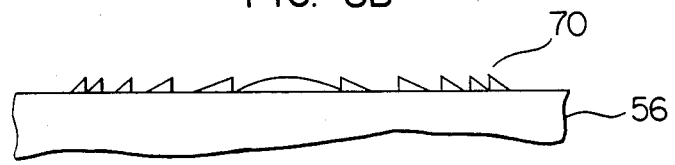

FIGS. 7A and 7B show, respectively, in a sectional view and a plan view an image sensor according to a second embodiment of the invention. This image sensor differs from the first embodiment in that a Fresnel lens array is formed in the major surface 56a of the transparent substrate 56 in place of the convex lens array. In FIGS. 7A and 7B, same parts as those shown in FIGS. 5A and 5B are denoted by same reference numerals and can be realized in the substantially same size as the latter. Accordingly, any further description of these parts or elements will be unnecessary. Referring to FIG. 7B, the Fresnel lens 70 is so designed that the n-th zone as counted from the center has a diameter $R_n$ which is given by $$R_n \approx \sqrt{n \cdot \lambda \cdot f}$$

where n represents a natural number, $\lambda$ represents the wavelength of the light source 2, and f represents the focal length of the lens which is selected approximately equal to the thickness of the transparent substrate 57. The circular or annular zones of the Fresnel lens may be either of a rectangular cross-section as shown in FIG. 8A or of a triangular cross-section as shown in FIG. 8B. The Fresnel lens of the structure shown in FIG. 8B exhibits a higher light collection efficiency than the one shown in FIG. 8A.

Figure 9A:
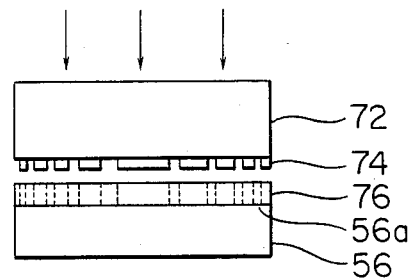
FIGS. 9(a)–9(c) are views of illustrating a process of fabricating Fresnel lens of the image sensor according to the second embodiment of the invention.
Figure 9B:
Figure 9C:
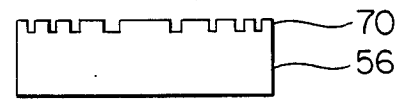

A process of fabricating the Fresnel lens shown in FIG. 8A will be described, by way of example, with reference to FIGS. 9(a)–9(c).

At first, the light shielding film is formed on the major surface of the transparent substrate 72 of glass, plastic or the like through vapor deposition of Cr or the like, which is followed by selective etching of the light shielding film 74 to thereby form a mask of the same pattern as the annular zones of the Fresnel lens array shown in FIGS. 7B and 8A.

Subsequently, photoresist 76 is applied over the major surface 56a of the transparent substrate 56. Next, the aforementioned mask is disposed on the photoresist layer 76 as shown in FIG. 9 at (a), and the photoresist layer 76 is selectively etched away through irradiation of ultraviolet rays, whereby the pattern of the mask 74 is transferred to the photoresist layer 76.

Next, the photoresist layer 76' having the mask pattern transferred is used as a mask for etching, the surface 56a of the transparent substrate 56, as shown in FIG. 9 at (c). Thereafter, the photoresist 76' is removed through a cleaning process. In this way, the Fresnel lens array is formed in the surface of the transparent substrate 56. In the Fresnel lens array thus formed, the pitch p may be 125 $\mu$m, the minimum distance d between the adjacent annular zones of each Fresnel lens may be 1 to 3 $\mu$m, and the lens thickness t may be about 0.5 to 10 $\mu$m, by way of example. The transparent substrate 56 should preferably be about 1.0 to 5.0 mm thick so that the substrate 56 can withstand the photolithography treatment. Accordingly, the focal length f of the Fresnel lens may be about 1.0 to 5.0 mm, while the optical path length may be about 1.0 to 10.0 mm. In case the Fresnel lenses of the dimensions mentioned above are employed, the light spot focussed on the photosensor 50 may be about 3 $\mu$m in diameter for the light receiving region of the sensor 50 which is about 10 $\mu$m.

The transparent substrate having the Fresnel lens array formed in the manner described above is bonded to the transparent substrate 70 incorporating the photosensors 50 to complete the image sensor. In the case of the instant embodiment, the transparent substrate 56 need not contain a metal ion such as Na or Pb ion but may be formed of conventional glass or plastic material having same light transmission characteristics as spectral characteristics of the photodiode, differing from the transparent substrate 56 of the first embodiment.

Figure 10:
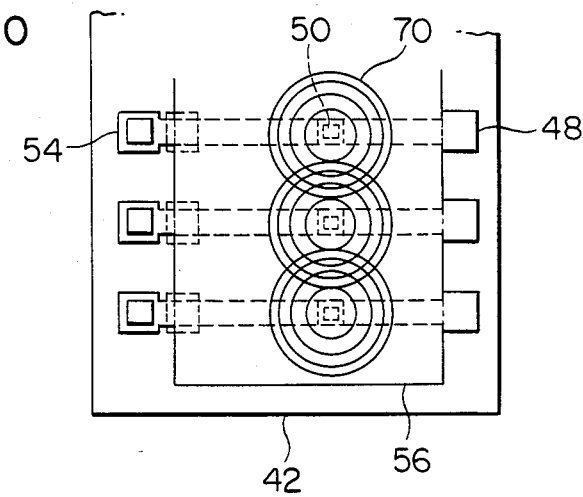
FIG. 10 is a view showing a modified arrangement of the Fresnel lens which can be employed in the second embodiment of the invention.

The Fresnel lens shown in FIG. 8B may be formed in the manner mentioned below, by way of example. At first, a photoresist is applied over the substrate surface, and the annular zone pattern is printed on the surface of the photoresist layer with the aid of an electron beam irradiation apparatus. In each annular zone, the beam intensity or exposure time is varied in the radial direction of the Fresnel lens, to thereby vary the polimerization degree of the photoresist. In this way, the individual annular zones printed or depicted on the photoresist are converted into stepped setbacks in cross-section thereof. By using the photoresist layer shaped in this manner as a stamping die, the Fresnel lens shown in FIG. 8B can be realized. Further, the Fresnel lens array may be so configured that the annular zones of the adjacent lenses overlap one another, as is shown in FIG. 10. In that case, pitch of the photosensors can be shortened and high efficiency of light collection can be obtained as in the case of the Fresnel lens array shown in FIG. 8B.

It will be readily understood that the Fresnel lens can be realized in a reduced size with an enhanced light collection efficiency and is susceptible to correction or compensation of aberations, because the Fresnel lens can generally be formed with an improved form factor.

In the case of the first and second embodiments described above, there is provided in addition to the transparent substrate 40 incorporating the photosensor 50 other transparent substrate 56 which is formed with lens 58 or 70, wherein the photosensor is illuminated with light through the lens and the transparent substrate 50. To this end, the light receiving region of the photosensor is provided on the side of the transparent substrate 40 opposite to the light source.

In contrast, in each of the image sensors according to third and fourth embodiments of the invention described below, the lens is formed on one major surface of a transparent substrate having the photosensor implemented in the other major surface, wherein the photosensor is illuminated through the associated lens and the body of the transparent substrate. Accordingly, the light receiving region of the photosensor is located on the same side as the light source with respect to the transparent substrate.

Figure 11A:
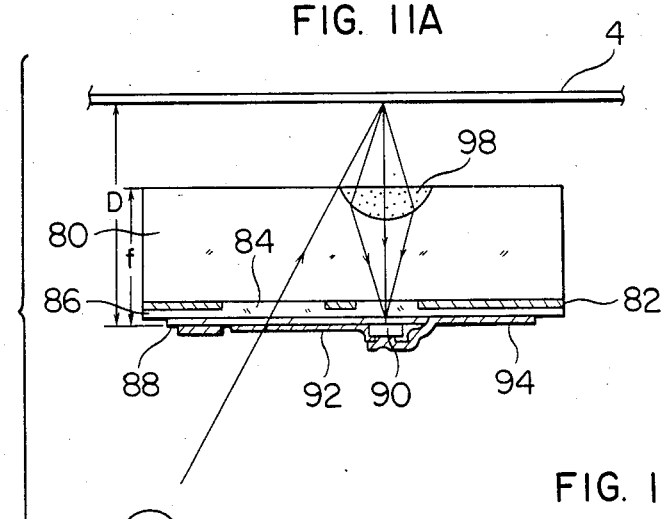
FIGS. 11A and 11B are, respectively, sectional view and plan view showing an image sensor according to a third embodiment of the invention.
Figure 11B:
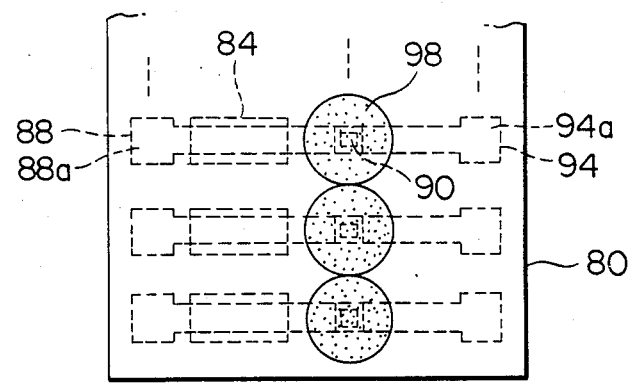

FIGS. 11A and 11B show an image sensor according to the third embodiment of the invention in a sectional view and a plan view, respectively.

Referring to the figures, a reference numeral 80 denotes a transparent substrate which may preferably be formed of a transparent material containing Na, Tl, Cs, Sr, Ba, Zn, Sn or Pb ions such as, for example, glass, plastic or the like so that the substrate can withstand the temperature and other influences encountered in the semiconductor fabrication process and that a lens array 94 can be formed through ion exchanging process. A numeral 82 denotes a light shielding film for intercepting light produced by a light source 2. This film 82 may be formed through vapor deposition of a material such as Cr or the like all over the major surface of the transparent substrate 80 which is located on the side of the light source 2. A plurality of windows 84 are formed in the light shielding film 82 through selective etching at locations corresponding to the photosensors, respectively. A numeral 86 denotes a transparent insulation film formed of $SiO_2$ or the like and deposited all over the major surface of the light shielding film 82 inclusive of the windows 84 through CVD process, by way of example. A numeral 88 denotes plate-like transparent electrodes formed on the major surface of the transparent insulation film 86 through chemical vapor deposition (CVD) of an electrically conductive transparent material such as e.g. ITO. Each electrodes has an end portion serving as output terminal for external connection and the other end portion on which a photodiode 90 serving as the photosensor is disposed. The photodiode 90 is made of a semiconductor material incorporating PIN-junction therein. A transparent insulation film 92 is deposited over the top faces and side surfaces of the electrodes 88 exclusive of the output terminal end portions 99a.

Formed on the top surfaces of the individual diodes 90 (i.e. the major surfaces) located in opposition to the transparent electrodes 88 are plate-like electrodes 94 which are formed through vapor deposition of a suitable material such as e.g. ITO. Each electrode 94 extends over the transparent insulation film 86 in the direction opposite to the electrodes 88 with the end portion 94a thereof forming the output terminal for external connection.

In this way, the photosensor units each constituted by the photodiode 90 and the electrodes 88 and 94 connected thereto are arrayed in a row in the direction perpendicular to the direction in which the electrodes 88 and 94 extend, to thereby constitute the photosensor array, as shown in FIG. 11B.

The photosensor unit (82~94) is about 2 to 3 μm thick.

In the major surface of the transparent substrate 80 located on the side of the document 4, lenses 98 are formed in one-to-one correspondence with the photodiodes 90, respectively. Each lens 90 is so realized that the focal length thereof substantially coincides with the thickness of the transparent substrate 80 so that the incident light can be focussed onto the light receiving region of the photodiode 90.

After formation of the photosensor units (82~94), the lenses 90 are formed in a manner similar to the process described hereinbefore in conjunction with the embodiment shown in FIGS. 5A and 5B. Since the transparent substrate 80 has to withstand the handling or treatment encountered in fabrication of the photosensor units, the thickness of the substrate should preferably be in a range of 0.2 mm to 0.5 mm. Consequently, the focal length f of the lens is in a range of 0.2 mm to 5.0 mm, while the optical path length is about 0.2 mm to 10.0 mm.

Figure 12A:
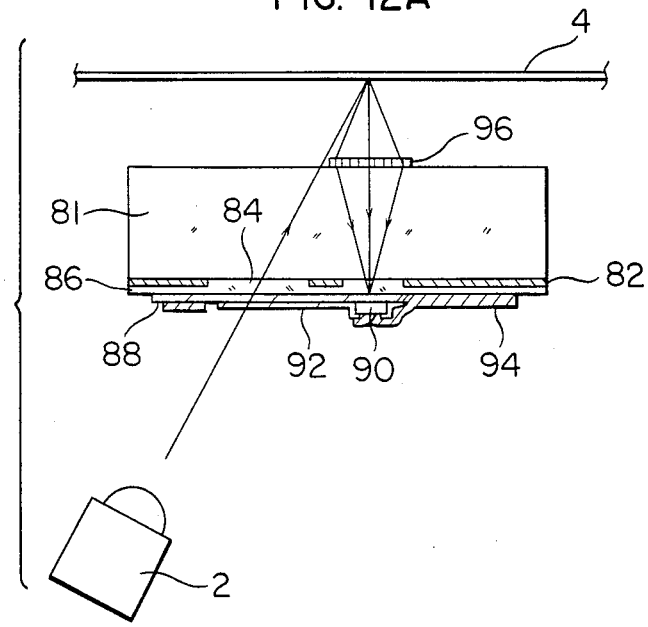
FIGS. 12A and 12B are, respectively, sectional view and plan view showing an image sensor according to a fourth embodiment of the invention.
Figure 12B:
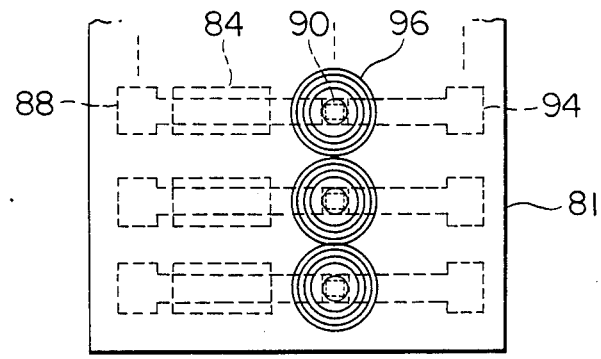

FIGS. 12A and 12B show a fourth embodiment of the invention in a sectional view and a plan view, respectively. This embodiment differs from the third embodiment in that Fresnel lenses 96 are formed in the major surface of the transparent substrate 80 in place of the lenses 98. In FIGS. 12A and 12B, same or equivalent parts as those of the third embodiment are denoted by like reference symbols. In the case of the image sensor according to the fourth embodiment of the invention, the transparent substrate 81 should preferably be made of a material capable of withstanding the temperature and other influences encountered in the semiconductor fabricating process. The material in concern may be boro-silicated glass, Pyrex or the like. The thickness of the transparent substrate 81 should preferably be in a range of 0.2 to 5.0 mm so that the substrate can withstand the handling and treatment effected in the course of the semiconductor fabricating process.

The photosensor units (92~94) may be realized in the same manner as the process described hereinbefore in conjunction with the third embodiment. After formation of the photosensor units on one major surface of the transparent substrate 81, the Fresnel lens array is formed in the other major surface through a process similar to that described hereinbefore in conjunction with the second embodiment.

In the case of the instant embodiment, the annular zones of the adjacent Fresnel lenses of the Fresnel lens array may partially overlap one another.

In the third and fourth embodiments, the thickness of the image sensor can be reduced by the thickness of the transparent substrate 40 when compared with the first and second embodiments.

In each of the embodiments of the invention described above, advantageous characteristics listed in the Table 1 can be obtained, and thus the length of the optical path extending from the document to the photosensor can be shortened with the result of the sensor output being increased.

In connection with the embodiments shown in FIGS. 5A, 7A, 11A and 12A, it has been described that the electrodes 54 and 88 are transparent. However, it should be appreciated that these electrodes may be of an opaque material without appreciable influence on the sensor output, provided that width of the electrode as viewed in the direction along the photosensor array is narrowed or the windows 44 and 84 are enlarged.

In the foregoing description, it has been assumed that the light source 2 is provided separately from the image sensor. However, it will be understood that the light source 2 may be incorporated in the transparent substrate in which the lenses are formed or alternatively provided intergrally with the photosensor unit.

In case a fluorescent lamp or a LED is employed as the light source, the transparent substrates 40, 56, 57, 80 and 81 as well as the transparent insulation films 94 and 84 may be of the materials described hereinbefore.

Figure 13:
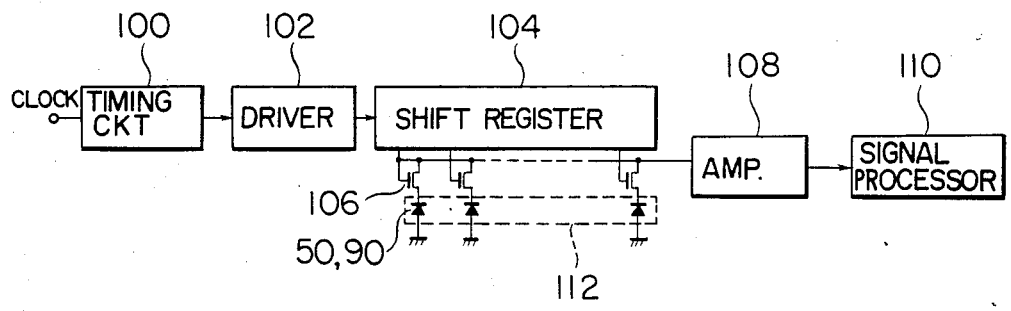
FIG. 13 is a circuit diagram of a facsimile equipment to which the image sensor according to the present invention is applied.

FIG. 13 shows, by way of example, a circuit configuration for a facsimile equipment to which the image sensor according to the invention is applied.

A timing circuit 100 responds to a clock signal to produce a timing clock signal which is supplied to a shift register 104 through a driver 102. The shift register responds to the timing clocks to turn on switching elements 106 sequentially, whereby the output signals of the corresponding photodiodes are supplied to a signal processing circuit 110 through an amplifier 108.

A numeral 112 denotes the photodiode array realized in accordance with the teachings of the invention, wherein one electrode of each photodiode 50 (or 90) is connected to the ground through one of the electrodes 54 (or 88) and 48 (or 44), while the other electrode is connected to the associated switching element through one of the electrodes 54 (or 88) and 48 (or 94).

The photosensors may be arrayed in a row, as shown in FIG. 13, or alternatively in a matrix configuration.

We claim:

1. An image line sensor for converting optical information into an electircal signal, comprising:
    a transparent substrate;
    a plurality of optical lenses formed integrally in one major surface of said transparent substrate and arrayed in a row as a micro-optical lens array; and
    a plurality of thin film photosensors arrayed in a row as a thin film photosensor array formed in the other major surface of said transparent substrate and provided in correspondence to said plurality of optical lenses, respectively, each of said thin film photosensors having output electrodes;
    wherein light corresponding to information to be sensed which is incident on said plurality of optical lenses of said micro-optical lens array is focused by said lenses onto the corresponding thin film photosensors, respectively, through said transparent substrate, each of said thin film photosensors of said thin film photosensor array is arranged for receiving light corresponding to the information sensed which information is carried on a document disposed adjacent said one major surface of said transparent substrate, and said thin film photosensors provide an electrical output signal on said output electrodes corresponding to the information.

2. An image line sensor according to claim 1, wherein said transparent substrate is formed of a material which transmits light of a frequency falling within a range of photosensitivity of each of said thin film phtosensors.

3. An image line sensor according to claim 2, wherein each of said optical lenses is constituted by a convex lens which is formed by doping metal ions in said one major surface of said transparent substrate.

4. An image line sensor according to claim 2, wherein each of said optical lenses is constituted by a Fresnel lens formed in said one major surface of said transparent substrate.

5. An image line sensor according to claim 4, wherein said Fresnel lenses are formed through a photolithography process.

6. An image line sensor according to claim 1, wherein each of said optical lenses for focusing the light corresponding to the information to be sensed onto said photosensor has a focal length no greater than 5.0 mm.

7. An image line sensor according to claim 1, wherein the optical path length of the light corresponding to the information to be sensed extending between the document and each of said thin film sensors through each of said optical lenses is no greater than 10 mm.

8. An image line sensor according to claim 1, further comprising a light shielding film having a plurality of light transmissive windows formed on said other major surface of said transparent substrate, each of said thin film photosensors being formed on said light shielding film, at least one of said light transmissive windows is arranged for transmitting light therethrough in a direction toward said other major surface of said transparent substrate and through said transparent substrate onto the document adjacent said one major surface of said transparent substrate, each of said thin film photosensors being disposed adjacent to at least on other of said light transmissive windows of said light shielding film for receiving reflected light from the document corresponding to the information to be sensed and radiated through a corresponding one of said optical lenses, said transparent substrate and said at least one other window of said light shielding film onto said thin film photosensor array.

9. An image line sensor for use in a facsimile apparatus according to claim 1, wherein said image line sensor is disposed adjacent to the document carrying the information to be sensed, the document being disposed adjacent said one major surface of said transparent substrate so that light transmitted in a direction toward said other major surface of said transparent substrate and through said transparent substrate onto the document said one major surface of said transparent substrate is reflected from the document and the reflected light corresponds to the information to be sensed, the reflected light corresponding to the information to be sensed is incident on said plurality of optical lenses of said micro-optical lens array and is focused by said optical lenses onto the corresponding thin film photosensors, respectively, through said transparent substrate, whereby said thin film photosensors provide an electrical signal corresponding to the inforation.

10. An image line sensor comprising:
    a first transparent substrate having a micro-optical lens array formed integrally on one major surface thereof; and
    a second transparent substrate having a thin film photosensor array formed integrally on one major surface thereof, the other major surface of said first transparent substrate being bonded on said one major surface of said second transparent substrate, said thin film photosensor array having output electrodes for providing an electrical output signal corresponding to information to be sensed.

* * * * *